(12) United States Patent
Volkovich et al.

(10) Patent No.: US 11,360,398 B2
(45) Date of Patent: Jun. 14, 2022

(54) SYSTEM AND METHOD FOR TILT CALCULATION BASED ON OVERLAY METROLOGY MEASUREMENTS

(71) Applicant: KLA Corporation, Milpitas, CA (US)

(72) Inventors: Roie Volkovich, Hadera (IL); Paul MacDonald, Milpitas, CA (US); Ady Levy, San Jose, CA (US); Jincheng Pei, Shanghai (CN); Jinyan Song, Milpitas, CA (US); Amnon Manassen, Haifa (IL)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/087,417

(22) Filed: Nov. 2, 2020

(65) Prior Publication Data

US 2021/0149313 A1    May 20, 2021

Related U.S. Application Data

(60) Provisional application No. 62/935,310, filed on Nov. 14, 2019.

(51) Int. Cl.
   *G03F 7/20*    (2006.01)
(52) U.S. Cl.
   CPC .......... *G03F 7/70633* (2013.01); *G03F 7/705* (2013.01); *G03F 7/7085* (2013.01)
(58) Field of Classification Search
   CPC ............... G03F 7/70633; G03F 7/7085; G03F 7/70483–70541; G03F 7/70616–70683;
   (Continued)

(56) References Cited

U.S. PATENT DOCUMENTS

2013/0308142 A1* 11/2013 Straaijer ............... G01B 11/24
                                              356/625
2017/0235233 A1*  8/2017 Lee .................... G03F 7/70633
                                              355/67
(Continued)

FOREIGN PATENT DOCUMENTS

EP         3457212 A1     3/2019

OTHER PUBLICATIONS

PCT International Search Report and Written Opinion for International Application No. PCT/US2020/059898 dated Jul. 28, 2021, 9 pages.

*Primary Examiner* — Christina A Riddle
(74) *Attorney, Agent, or Firm* — Suiter Swantz pc llo

(57) ABSTRACT

A metrology system includes a controller communicatively coupled to one or more metrology tools. In another embodiment, the controller includes one or more processors configured to execute program instructions causing the one or more processors to receive one or more overlay metrology measurements of one or more metrology targets of the metrology sample from the one or more metrology tools; determine tilt from the one or more measurement overlay measurements; and determine one or more correctables for at least one of one or more lithography tools or the one or more metrology tools to adjust for the tilt, where the one or more correctables are configured to reduce an amount of tilt in the sample or overlay inaccuracy of the one or more overlay metrology measurements. The program instructions further cause the one or more processors to predict tilt with a simulator based on at least the determined tilt.

45 Claims, 13 Drawing Sheets

(58) Field of Classification Search
CPC .............. G03F 7/70716; G03F 7/70725; G03F 7/70775; G03F 7/70991; G03F 9/7003; G03F 9/7023–7034; G03F 9/7088; G03F 9/7092; G03F 9/7096
USPC ............ 355/18, 30, 52–77; 430/5, 8, 22, 30, 430/311; 250/492.1, 492.2, 492.22, 250/492.3, 493.1, 504 R; 356/399–401, 356/601–640
See application file for complete search history.

(56) References Cited

U.S. PATENT DOCUMENTS

| | | | |
|---|---|---|---|
| 2018/0173099 A1* | 6/2018 | Affentauschegg | G03F 7/7055 |
| 2018/0253017 A1* | 9/2018 | Adel | G03F 7/705 |
| 2018/0275524 A1* | 9/2018 | Den Boef | G03F 7/70516 |
| 2018/0364591 A1* | 12/2018 | Socha | G03F 7/70633 |
| 2020/0356013 A1* | 11/2020 | Van Dongen | H01L 21/3065 |

* cited by examiner

|  | P-Pol | |
|---|---|---|
|  | X | Y |
| OVL mean +3 sigma | 9.22 | 13.73 |
| OVL Range | 13.54 | 18.2 |

SYSTEM AND METHOD FOR TILT CALCULATION BASED ON OVERLAY METROLOGY MEASUREMENTS

CROSS-REFERENCE TO RELATED APPLICATIONS

The present application claims the benefit under 35 U.S.C. § 119(e) of U.S. Provisional Patent Application Ser. No. 62/935,310, filed Nov. 14, 2019, titled TILT CALCULATION BASED ON OPTICAL OVERLAY METROLOGY MEASUREMENTS AND NOVEL USE CASES, naming Roie Volkovich, Paul MacDonald, Ady Levy, Jason Pei, Jinyan Song, and Amnon Manassen as inventors, which is incorporated herein by reference in the entirety.

TECHNICAL FIELD

The present invention generally relates to metrology systems, and, more particularly, to a system and method for tilt calculation based on overlay measurements.

BACKGROUND

Metrology systems typically measure the alignment of multiple layers of a sample by characterizing metrology targets having target features located on sample layers of interest. Current systems include dedicated tilt tools for measuring or determining tilt induced by an etch process on a single metrology target, with values generated for the single metrology target between a current layer and a previous layer of the sample, after the etch process has been performed. The current systems may be sensitive to different errors originating from error sources such as process variations, lithography processes, and metrology processes. Etched wafers may not be able to be re-worked should out of specification (OOS) tilts be observed, which may result in an increased throughput time and may require additional calibration to reduce the type and/or number of error sources before the errors are generated.

Therefore, it would be desirable to provide a system and method to cure the shortfalls of the previous approaches identified above.

SUMMARY

A system for tilt calculation is disclosed, in accordance with one or more embodiments of the present disclosure. In one embodiment, the system includes a controller communicatively coupled to one or more metrology tools configured to hold a metrology sample. In another embodiment, the controller includes one or more processors configured to execute program instructions. In another embodiment, the program instructions cause the one or more processors to receive one or more overlay metrology measurements of one or more metrology targets of the metrology sample from the one or more metrology tools. In another embodiment, the one or more overlay metrology measurements are taken following an after develop inspection (ADI) process. In another embodiment, the program instructions cause the one or more processors to determine tilt from the one or more overlay metrology measurements. In another embodiment, the program instructions cause the one or more processors to predict tilt with a simulator based on at least the determined tilt. In another embodiment, the program instructions cause the one or more processors to determine one or more correctables for at least one of one or more lithography tools or the one or more metrology tools to adjust for the predicted tilt. In another embodiment, the one or more correctables are configured to reduce an amount of tilt in the sample or overlay inaccuracy of the one or more overlay metrology measurements.

A system for error reduction in metrology measurements is disclosed, in accordance with one or more embodiments of the present disclosure. In one embodiment, the system includes one or more metrology tools configured to hold a metrology sample. In another embodiment, the system includes a controller communicatively coupled to the one or more metrology tools. In another embodiment, the controller includes one or more processors configured to execute program instructions. In another embodiment, the program instructions cause the one or more processors to receive one or more overlay metrology measurements of one or more metrology targets of the metrology sample from the one or more metrology tools. In another embodiment, the one or more overlay metrology measurements are taken following an after develop inspection (ADI) process. In another embodiment, the program instructions cause the one or more processors to determine tilt from the one or more overlay metrology measurements. In another embodiment, the program instructions cause the one or more processors to predict tilt with a simulator based on at least the determined tilt. In another embodiment, the program instructions cause the one or more processors to determine one or more correctables for at least one of one or more lithography tools or the one or more metrology tools to adjust for the predicted tilt. In another embodiment, the one or more correctables are configured to reduce an amount of tilt in the sample or overlay inaccuracy of the one or more overlay metrology measurements.

A method is disclosed in accordance with one or more embodiments of the present disclosure. In one embodiment, the method may include, but is not limited to, receiving one or more overlay metrology measurements of one or more metrology targets of a metrology sample from one or more metrology tools. In another embodiment, the one or more overlay metrology measurements are taken following an after develop inspection (ADI) process. In another embodiment, the method may include, but is not limited to, determining tilt from the one or more overlay metrology measurements. In another embodiment, the method may include, but is not limited to, predicting tilt with a simulator based on at least the determined tilt. In another embodiment, the method may include, but is not limited to, determining one or more correctables for at least one of one or more lithography tools or the one or more metrology tools to adjust for the predicted tilt. In another embodiment, the one or more correctables are configured to reduce an amount of tilt in the sample or overlay inaccuracy of the one or more overlay metrology measurements.

A system for error reduction in metrology measurements is disclosed, in accordance with one or more embodiments of the present disclosure. In one embodiment, the system includes a controller communicatively coupled to one or more metrology tools configured to hold a metrology sample. In another embodiment, the controller includes one or more processors configured to execute program instructions. In another embodiment, the program instructions cause the one or more processors to receive one or more overlay metrology measurements of one or more metrology targets of the metrology sample from the one or more metrology tools. In another embodiment, the one or more overlay metrology measurements are taken during an after etch inspection (AEI) process. In another embodiment, the program instructions cause the one or more processors to determine tilt from the one or more overlay metrology measurements. In another embodiment, the program instructions cause the one or more processors to predict tilt with a simulator based on at least the determined tilt. In another embodiment, the program instructions cause the one or more processors to determine one or more correctables for at least one of one or more lithography tools or the one or more metrology tools to adjust for the determined tilt. In another embodiment, the one or more correctables are configured to reduce an amount of tilt in the sample or overlay inaccuracy of the one or more overlay metrology measurements.

A system for error reduction in metrology measurements is disclosed, in accordance with one or more embodiments of the present disclosure. In one embodiment, the system includes one or more metrology tools configured to hold a metrology sample. In another embodiment, the system includes a controller communicatively coupled to the one or more metrology tools. In another embodiment, the one or more overlay metrology measurements are taken during an after etch inspection (AEI) process. In another embodiment, the program instructions cause the one or more processors to determine tilt from the one or more overlay metrology measurements. In another embodiment, the program instructions cause the one or more processors to predict tilt with a simulator based on at least the determined tilt. In another embodiment, the program instructions cause the one or more processors to determine one or more correctables for at least one of one or more lithography tools or the one or more metrology tools to adjust for the determined tilt. In another embodiment, the one or more correctables are configured to reduce an amount of tilt in the sample or overlay inaccuracy of the one or more overlay metrology measurements.

A method is disclosed in accordance with one or more embodiments of the present disclosure. In one embodiment, the method may include, but is not limited to, receiving one or more overlay metrology measurements of one or more metrology targets of a metrology sample from one or more metrology tools. In another embodiment, the one or more overlay metrology measurements are taken during an after etch inspection (AEI) process. In another embodiment, the method may include, but is not limited to, determining tilt from the one or more overlay metrology measurements. In another embodiment, the method may include, but is not limited to, predicting tilt with a simulator based on at least the determined tilt. In another embodiment, the method may include, but is not limited to, determining one or more correctables for at least one of one or more lithography tools or the one or more metrology tools to adjust for the determined tilt. In another embodiment, the one or more correctables are configured to reduce an amount of tilt in the sample or overlay inaccuracy of the one or more overlay metrology measurements.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION

Figure 1A:
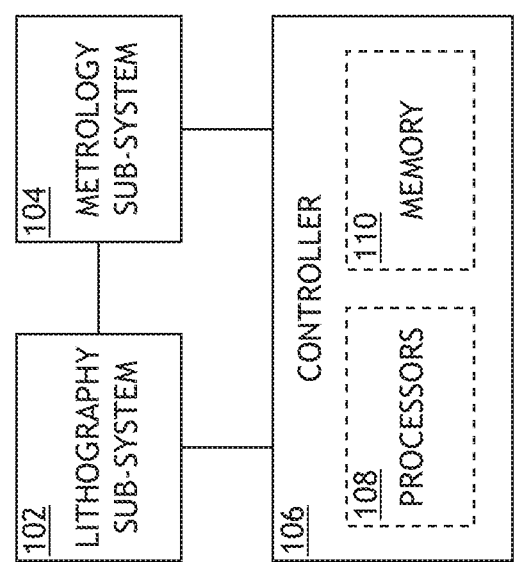
FIG. 1A is a simplified view illustrating a fabrication system, in accordance with one or more embodiments of the present disclosure.

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Reference will now be made in detail to the subject matter disclosed, which is illustrated in the accompanying drawings.

Metrology systems typically measure the alignment of multiple layers of a sample by characterizing metrology targets having target features located on sample layers of interest. Current systems include dedicated tilt tools for measuring or determining tilt induced by an etch process, after the etch process has been performed. The current systems may be sensitive to different errors originating from error sources such as process variations, lithography processes, and metrology processes. Etched wafers may not be able to be re-worked should out of specification (OOS) tilts be observed, which may result in an increased throughput measurement time and may require additional calibration to reduce the type and/or number of error sources before the errors are generated.

Overlay (OVL) metrology tools may utilize a variety of overlay metrology technologies to determine the overlay of sample layers on a single metrology target, with values generated for the single metrology target between a current layer and a previous layer of the sample. For example, the overlay metrology technologies may include, but are not limited to, imaging, scatterometry, or a combination of overlay metrology technologies.

To reduce or minimize tilt and/or allow for the re-work of the wafer, overlay metrology tools may replace the dedicated tilt tools. This replacement may allow for the predicting or calculating of tilt induced by an etching process for a next step, the predicting or calculating of the tilt occurs during an after develop inspection (ADI) process and/or an after etch inspection (AEI) process.

As such, embodiments of the present disclosure are directed to a system and method for tilt calculation based on overlay metrology measurements. Specifically, embodiments of the present disclosure are directed to methods for predicting and/or adjusting tilt signatures, and a corresponding system configured to predict for and/or adjust for tilt signatures.

Advantages of the present disclosure include determining tilt induced by an etching process using overlay AEI data. Advantages of the present disclosure also include calculating etch tilt for a previous layer using overlay ADI data. Advantages of the present disclosure also include predicting tilt for an N+1 etch step using overlay ADI data. Advantages of the present disclosure also include correcting an overlay measurement in an ADI process based on tilt information for a previous layer for better overlay accuracy.

FIGS. 1A-7 in general illustrate a system and method for tilt calculation based on overlay metrology measurements, in accordance with one or more embodiments of the present disclosure.

Figure 1B:
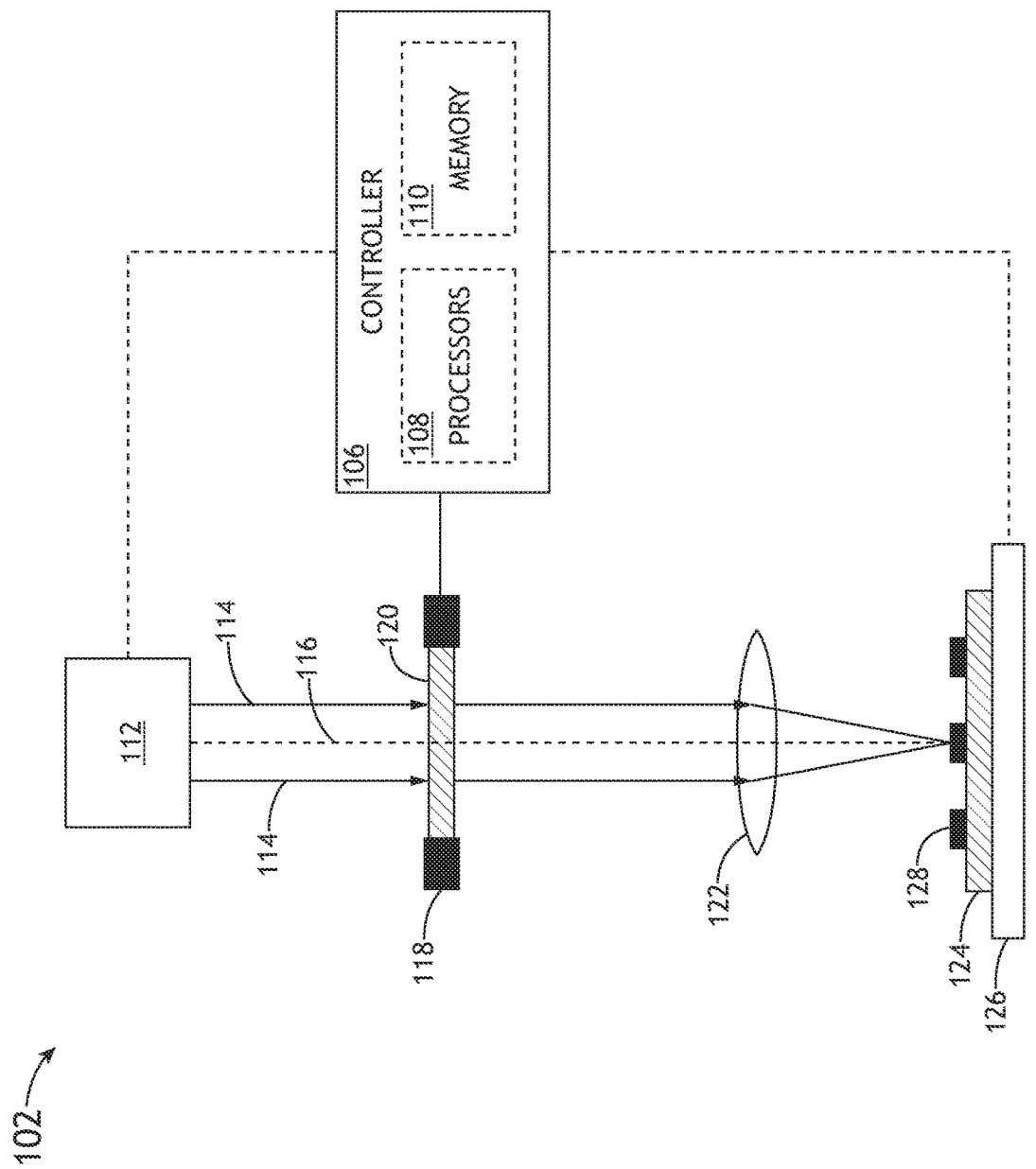
FIG. 1B is a simplified view illustrating a lithography sub-system of the fabrication system of FIG. 1A, in accordance with one or more embodiments of the present disclosure.
Figure 1C:
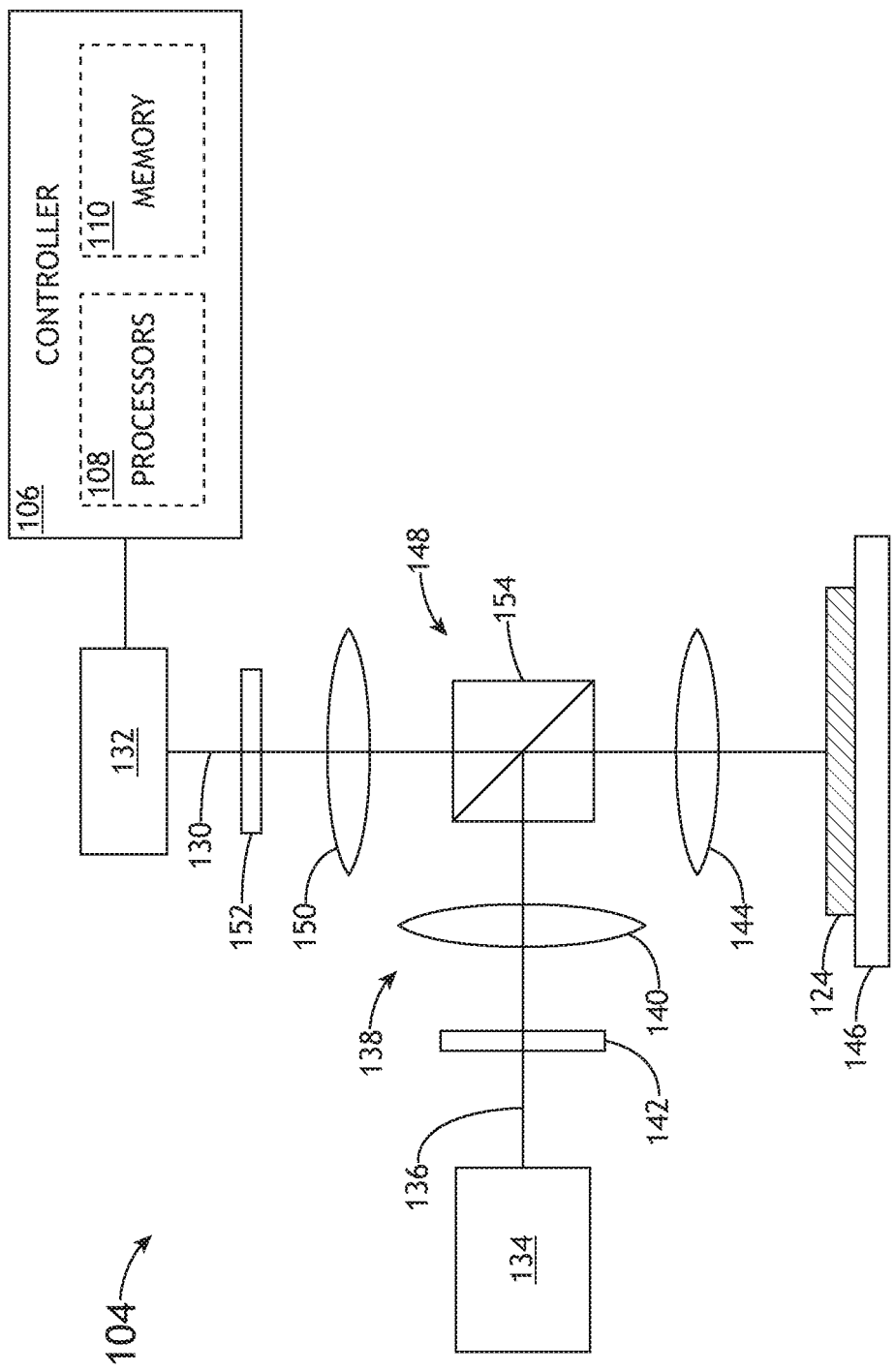
FIG. 1C is a simplified view of a metrology sub-system of the fabrication system of FIG. 1A, in accordance with one or more embodiments of the present disclosure.

FIGS. 1A-1C in general illustrate a system 100, in accordance with one or more embodiments of the present disclosure.

As illustrated in at least FIG. 1A, in one embodiment, the system 100 includes one or more lithography sub-systems 102 for lithographically imaging one or more pattern elements of a pattern mask (e.g., device pattern elements, metrology target pattern elements, or the like) on a sample. For the purposes of the present disclosure, it is noted herein that a lithography sub-system 102 may be referred to as a lithography tool. For example, the lithography sub-system 102 may include any lithographic tool known in the art including, but not limited to, an etcher, scanner, stepper, cleaner, or the like. A fabrication process may include fabricating multiple dies distributed across the surface of a sample (e.g., a semiconductor wafer, or the like), where each die includes multiple patterned layers of material forming a device component. Each patterned layer may be formed by lithography tools via a series of steps including material deposition, lithography, etching to generate a pattern of interest, and/or one or more exposure steps (e.g., performed by a scanner, a stepper, or the like). For purposes of the present disclosure, it is noted herein a lithography sub-system 102 may be a single lithography tool or may represent a group of lithography tools.

In another embodiment, the system 100 includes one or more metrology sub-systems 104 to characterize one or more features on the sample. The system 100 may incorporate metrology measurements at one or more points during a fabrication process to monitor and control the fabrication of features on a particular sample and/or across multiple samples. For the purposes of the present disclosure, it is noted herein that a metrology sub-system 104 may be referred to as a metrology tool. For example, the metrology sub-system 104 may include an overlay metrology tool suitable for measuring relative positions of features of a sample. In one embodiment, the metrology sub-system 104 includes an image-based metrology tool to measure metrology data based on the generation of one or more images of a sample. In another embodiment, the metrology sub-system 104 includes an electron beam-based metrology system. For example, the metrology sub-system 104 may include a scatterometry-based metrology system (e.g., a scatterometry overlay (SCOL) metrology system) to measure metrology data based on the scattering (reflection, diffraction, diffuse scattering, or the like) of light from the sample. For purposes of the present disclosure, it is noted herein a metrology sub-system 104 may be a single metrology tool or may represent a group of metrology tools.

It is noted herein that an adjustment to the system 100 based on a characterization of a sample may reduce noise originating from one or more sources of errors including, but not limited to, process variations, lithography processes, and metrology processes. For example, the one or more sources of errors may stem from a lithography flow and include, but are not limited to, mask printability errors, lithography tool errors, process tool errors (e.g., etchers, cleaners, or the like), and metrology tool errors.

In another embodiment, the system 100 includes a controller 106. The controller 106 may include one or more processors 108 configured to execute program instructions maintained on a memory medium 110. In this regard, the one or more processors 108 of controller 106 may execute any of the various process steps described throughout the present disclosure.

The one or more processors 108 of a controller 106 may include any processing element known in the art. In this sense, the one or more processors 108 may include any microprocessor-type device configured to execute algorithms and/or instructions. For example, the algorithms and/or instructions may include, but are not limited to, calculations using different weighted averages (e.g., where weighting may be generated using metrology target quality), a machine learning algorithm, and/or other algorithmic-based methodology. In one embodiment, the one or more processors 108 may consist of a desktop computer, mainframe computer system, workstation, image computer, parallel processor, or any other computer system (e.g., networked computer) configured to execute a program configured to operate the system 100, as described throughout the present disclosure. It is further recognized that the term "processor" may be broadly defined to encompass any device having one or more processing elements, which execute program instructions from a non-transitory memory medium 110. Further, the steps described throughout the present disclosure may be carried out by a single controller 106 or, alternatively, multiple controllers. In addition, the controller 106 may include one or more controllers housed in a common housing or within multiple housings. In this way, any controller or combination of controllers may be separately packaged as a module suitable for integration into system 100. Further, the controller 106 may analyze data received from a detector and feed the data to additional components within the system 100 (e.g., the lithography sub-system 102) or external to the system 100.

The memory medium 110 may include any storage medium known in the art suitable for storing program instructions executable by the associated one or more processors 108. For example, the memory medium 110 may include a non-transitory memory medium. By way of another example, the memory medium 110 may include, but is not limited to, a read-only memory, a random-access memory, a magnetic or optical memory device (e.g., disk), a magnetic tape, a solid-state drive and the like. It is further noted that memory medium 110 may be housed in a common controller housing with the one or more processors 108. In one embodiment, the memory medium 110 may be located remotely with respect to the physical location of the one or more processors 108 and controller 106. For instance, the one or more processors 108 of controller 106 may access a remote memory (e.g., server), accessible through a network (e.g., internet, intranet and the like). Therefore, the above description should not be interpreted as a limitation on the present invention but merely an illustration.

As illustrated in at least FIG. 1B, in one embodiment, the lithography sub-system 102 includes a lithography illumination source 112 configured to generate an illumination beam 114. The one or more illumination beams 114 may include one or more selected wavelengths of light including, but not limited to, ultraviolet (UV) radiation, visible radiation, or infrared (IR) radiation.

Illumination from the lithography illumination source 112 may have any spatial distribution (e.g., illumination pattern). For example, the lithography illumination source 112 may include, but is not limited to, a single-pole illumination source, a dipole illumination source, a C-Quad illumination source, a Quasar illumination source, or a free-form illumination source. In this regard, the lithography illumination source 112 may generate on-axis illumination beams 114 in which illumination propagates along (or parallel to) an optical axis 116 and/or any number of off-axis illumination beams 114 in which illumination propagates at an angle to the optical axis 116.

It is noted herein that, for the purposes of the present disclosure, an illumination pole of the lithography illumination source 112 may represent illumination from a specific location. In this regard, each spatial location of the lithography illumination source 112 (e.g., with respect to the optical axis 116) may be considered an illumination pole. Further, an illumination pole may have any shape or size known in the art. In addition, the lithography illumination source 112 may be considered to have an illumination profile corresponding to a distribution of illumination poles.

Further, the lithography illumination source 112 may generate the illumination beams 114 by any method known in the art. For example, an illumination beam 114 may be formed as illumination from an illumination pole of the lithography illumination source 112 (e.g., a portion of an illumination profile of a lithography illumination source 112, or the like). By way of another example, lithography illumination source 112 may include multiple illumination sources for the generation of multiple illumination beams 114.

In another embodiment, the lithography sub-system 102 includes a mask support device 118. The mask support device 118 is configured to secure a pattern mask 120. In another embodiment, the lithography sub-system 102 includes a set of projection optics 122 configured to project an image of the pattern mask 120 illuminated by the one or more illumination beams 114 onto a sample 124 disposed on a sample stage 126 in order to generate printed pattern elements corresponding to the image of the pattern mask 120. In another embodiment, the mask support device 118 may be configured to actuate or position the pattern mask 120. For example, the mask support device 118 may actuate the pattern mask 120 to a selected position with respect to the projection optics 122 of the system 100.

The sample 124 may include any number of photosensitive materials and/or material layers suitable for receiving the image of the pattern mask 120. For example, the sample 124 may include a resist layer 128. In this regard, the set of projection optics 122 may project an image of the pattern mask 120 onto the resist layer 128 to expose the resist layer 128 and a subsequent etching step may remove the exposed material (e.g., positive etching) or the unexposed material (e.g., negative etching) in order to provide printed features on the sample 124. Further, the pattern mask 120 may be utilized in any imaging configuration known in the art. For example, the pattern mask 120 may be a positive mask (e.g., a bright-field mask) in which pattern elements are positively imaged as printed pattern elements. By way of another example, the pattern mask 120 may be a negative mask (e.g., a dark-field mask) in which pattern elements of the pattern mask 120 form negative printed pattern elements (e.g., gaps, spaces, or the like).

The sample 124 may include one or more fields. Each field of the one or more fields includes one or more overlay metrology targets. For purposes of the present disclosure, it is noted herein that overlay metrology targets may be referred to as metrology targets or overlay targets. For example, a sample 124 may include four metrology targets for scatterometry technology. The one or more metrology targets may be of different types, such that different metrology targets have different target designs. The four metrology targets may be allocated near one another on the sample 124, but may be different in one or more of critical dimension (CD), pitch, and/or segmentation size. The four metrology targets may be located in several locations per field on each field of the sample 124, such that a total number of locations of metrology targets may be up to several thousand locations.

The controller 106 may be communicatively coupled to any element or combination of elements in the lithography sub-system 102 including, but not limited to, the mask support device 118 and/or the sample stage 126 to direct the transfer of pattern elements on a pattern mask 120 to a sample 124, the lithography illumination source 112 to control one or more characteristics of the illumination beam 114.

FIG. 1C is a block diagram view of the metrology sub-system 104, in accordance with one or more embodiments of the present disclosure. The system 100 may generate one or more images associated with light emanating from the sample 124 (e.g., sample light 130) on at least one detector 132 using any method known in the art. In one embodiment, the detector 132 is located at a field plane to generate an image of one or more features on the sample 124. In this regard, the system 100 may operate as an image-based overlay metrology tool. In another embodiment, the detector 132 is located at a pupil plane to generate an image based on angles of light emanating from the sample 124 (e.g., based on reflection, diffraction, scattering, or the like). In this regard, the system 100 may operate as a scatterometry-based metrology tool.

In one embodiment, the metrology sub-system 104 includes a metrology illumination source 134 to generate a metrology illumination beam 136. The metrology illumination source 134 may be the same as the lithography illumination source 112 or may be a separate illumination source configured to generate a separate metrology illumination beam 136. The metrology illumination beam 136 may include one or more selected wavelengths of light including, but not limited to, vacuum ultraviolet (VUV) radiation, deep ultraviolet (DUV) radiation, ultraviolet (UV) radiation, visible radiation, or infrared (IR) radiation. The metrology illumination source 134 may further generate a metrology illumination beam 136 including any range of selected wavelengths. In another embodiment, the metrology illumination source 134 may include a spectrally-tunable illumination source to generate a metrology illumination beam 136 having a tunable spectrum.

The metrology illumination source 134 may further produce a metrology illumination beam 136 having any temporal profile. For example, the metrology illumination source 134 may produce a continuous metrology illumination beam 136, a pulsed metrology illumination beam 136, or a modulated metrology illumination beam 136. In addition, the metrology illumination beam 136 may be delivered from the metrology illumination source 134 via free-space propagation or guided light (e.g., an optical fiber, a light pipe, or the like).

In another embodiment, the metrology illumination source 134 directs the metrology illumination beam 136 to the sample 124 via an illumination pathway 138. The illumination pathway 138 may include one or more lenses 140 or additional illumination optical components 142 suitable for modifying and/or conditioning the metrology illumination beam 136. For example, the one or more illumination optical components 142 may include, but are not limited to, one or more polarizers, one or more filters, one or more beam splitters, one or more diffusers, one or more homogenizers, one or more apodizers, one or more beam shapers, or one or more shutters (e.g., mechanical shutters, electro-optical shutters, acousto-optical shutters, or the like). By way of another example, the one or more illumination optical components 142 may include aperture stops to control the angle of illumination on the sample 124 and/or field stops to control the spatial extent of illumination on the sample 124. In one instance, the illumination pathway 138 includes an aperture stop located at a plane conjugate to the back focal plane of an objective lens 144 to provide telecentric illumination of the sample. In another embodiment, the system 100 includes an objective lens 144 to focus the metrology illumination beam 136 onto the sample 124.

In another embodiment, the sample 124 is disposed on a sample stage 146. The sample stage 146 may include any device suitable for positioning the sample 124 within the system 100. For example, the sample stage 146 may include any combination of linear translation stages, rotational stages, tip/tilt stages, or the like.

For purposes of the present disclosure, in some embodiments the sample 124 may be considered a metrology sample 124.

In another embodiment, a detector 132 is configured to capture radiation emanating from the sample 124 (e.g., sample light 130) through a collection pathway 148. For example, the collection pathway 148 may include, but is not required to include, a collection lens (e.g., the objective lens 144 as illustrated in FIG. 1C) or one or more additional collection pathway lenses 150. In this regard, a detector 132 may receive radiation reflected or scattered (e.g., via specular reflection, diffuse reflection, and the like) from the sample 124 or generated by the sample 124 (e.g., luminescence associated with absorption of the metrology illumination beam 136, or the like).

The collection pathway 148 may further include any number of collection optical components 152 to direct and/or modify illumination collected by the objective lens 144 including, but not limited to, one or more collection pathway lenses 150, one or more filters, one or more polarizers, or one or more beam blocks. In addition, the collection pathway 148 may include field stops to control the spatial extent of the sample imaged onto the detector 132 or aperture stops to control the angular extent of illumination from the sample used to generate an image on the detector 132. In another embodiment, the collection pathway 148 includes an aperture stop located in a plane conjugate to the back focal plane of an optical element the objective lens 144 to provide telecentric imaging of the sample.

The detector 132 may include any type of optical detector known in the art suitable for measuring illumination received from the sample 124. For example, a detector 132 may include a sensor suitable for generating one or more images of a static sample 124 (e.g., in a static mode of operation) such as, but is not limited to, a charge-coupled device (CCD), a complementary metal-oxide-semiconductor (CMOS) sensor, a photomultiplier tube (PMT) array, or an avalanche photodiode (APD) array. By way of another example, a detector 132 may include a sensor suitable for generating one or more images of a sample 124 in motion (e.g., a scanning mode of operation) including, but not limited to, a line sensor or a time delay and integration (TDI) sensor.

In another embodiment, a detector 132 may include a spectroscopic detector suitable for identifying wavelengths of radiation emanating from the sample 124. In another embodiment, the system 100 may include multiple detectors 132 (e.g., associated with multiple beam paths generated by one or more beam splitters) to facilitate multiple metrology measurements by the system 100.

In one embodiment, the system 100 includes a beam splitter 154 oriented such that the objective lens 144 may simultaneously direct the metrology illumination beam 136 to the sample 124 and collect radiation emanating from the sample 124. In this regard, the system 100 may be configured in an epi-illumination mode.

In another embodiment, as illustrated in FIGS. 1A-1C, the controller 106 is communicatively coupled to one or more elements of the system 100. In this regard, the controller 106 may transmit and/or receive data from any component of the system 100. For example, the controller 106 may be configured to receive data including, but not limited to, one or more images from the detector 132 of the sample 124.

In one embodiment, the sample 124 may be designed and/or fabricated to be used for the system and method for tilt calculation based on overlay metrology measurements described throughout the present disclosure.

Figure 2:
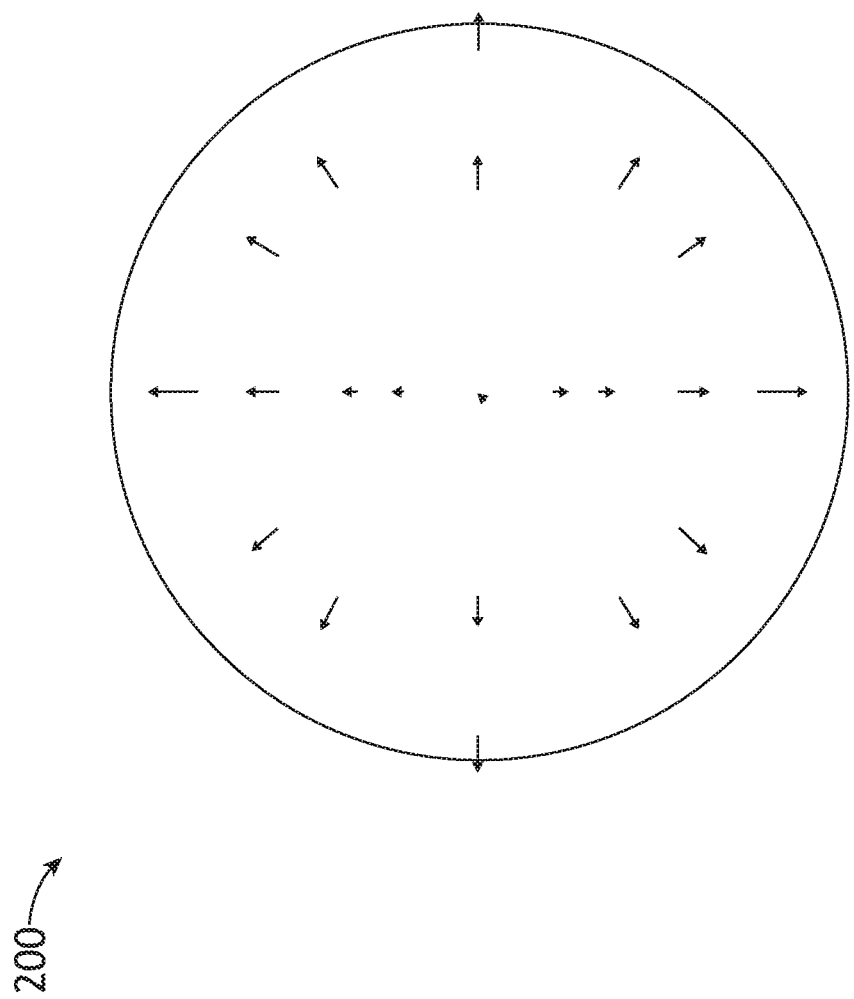
FIG. 2 illustrates a tilt signature induced by an etcher, in accordance with one or more embodiments of the present disclosure.

FIG. 2 is a signature graph 200 illustrating a tilt signature induced by a lithography sub-system 102, in accordance with one or more embodiments of the present disclosure. In one embodiment, the lithography sub-system 102 is an etcher, and the signature graph 200 includes a tilt signature induced by the etcher. In another embodiment, the tilt-induced etch illustrated in the signature graph 200 of FIG. 2 has a unique radial signature due to the etcher methodology of operation. It is noted herein tilt induced by the etcher (or etch process) is one factor for lost product yield, while preventing re-working of any wafer with high tilt (e.g., OOS tilt).

Figure 3A:
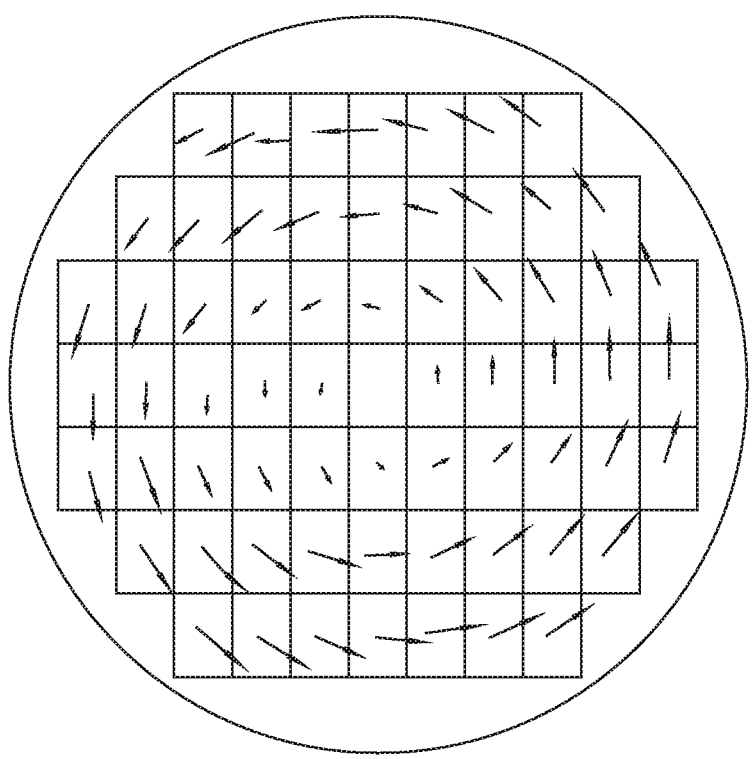
FIG. 3A illustrates an overlay signature measured during an after develop inspection (ADI) step, in accordance with one or more embodiments of the present disclosure.
Figure 3B:
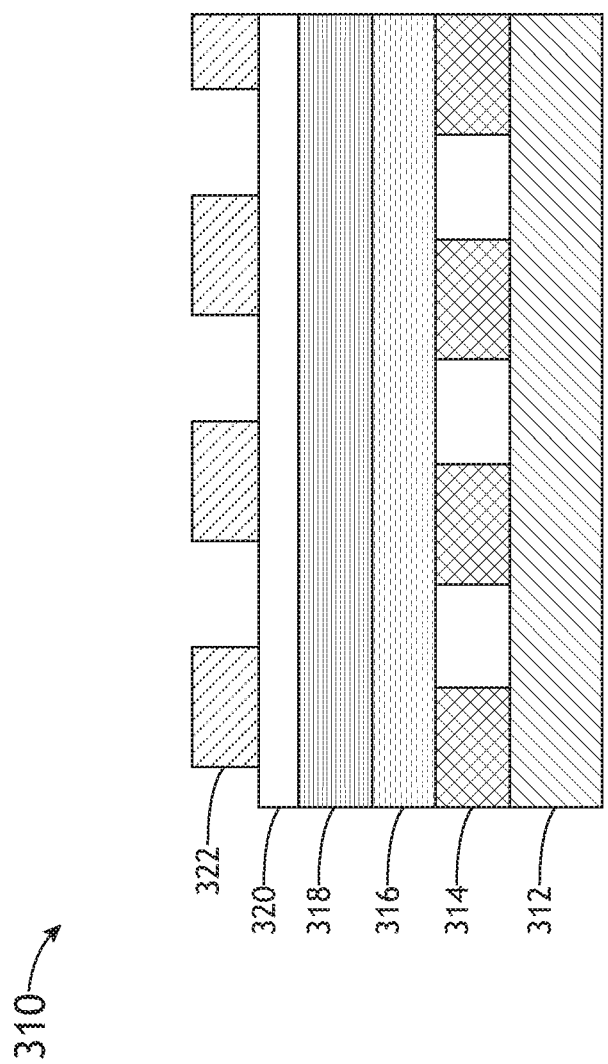
FIG. 3B illustrates a simplified schematic of a cross-section of a wafer during an ADI step, in accordance with one or more embodiments of the present disclosure.

FIG. 3A illustrates a signature graph 300 including an overlay signature measured in an ADI step, in accordance with one or more embodiments of the present disclosure. In one embodiment, the signature graph 300 includes a tilt signature induced by the etcher. In another embodiment, the tilt-induced etch illustrated in the signature graph 300 of FIG. 3A impacts the overlay measured during the ADI step. In another embodiment, the tilt-induced etch illustrated in the signature graph 300 of FIG. 3A impacts the overlay performance and accuracy. FIG. 3B illustrates an example cross-section of an ADI sample 310 corresponding to the signature graph 300, in accordance with one or more embodiments of the present disclosure. In one embodiment, the ADI sample 310 is fabricated from one or more layers. For example, the ADI sample 310 includes a silicon layer 312. By way of another example, the ADI sample 310 includes an AEI N−1 layer 314, or a layer fabricated in a previous (e.g., N−1) AEI step. By way of another example, the ADI sample 310 includes a polymer layer 316. By way of another example, the ADI sample 310 includes a hard mask layer 318. By way of another example, the ADI sample 310 includes a bottom anti-reflective coating (BARC) or layer 320. By way of another example, the ADI sample 310 includes a photo resist layer 322.

Figure 4A:
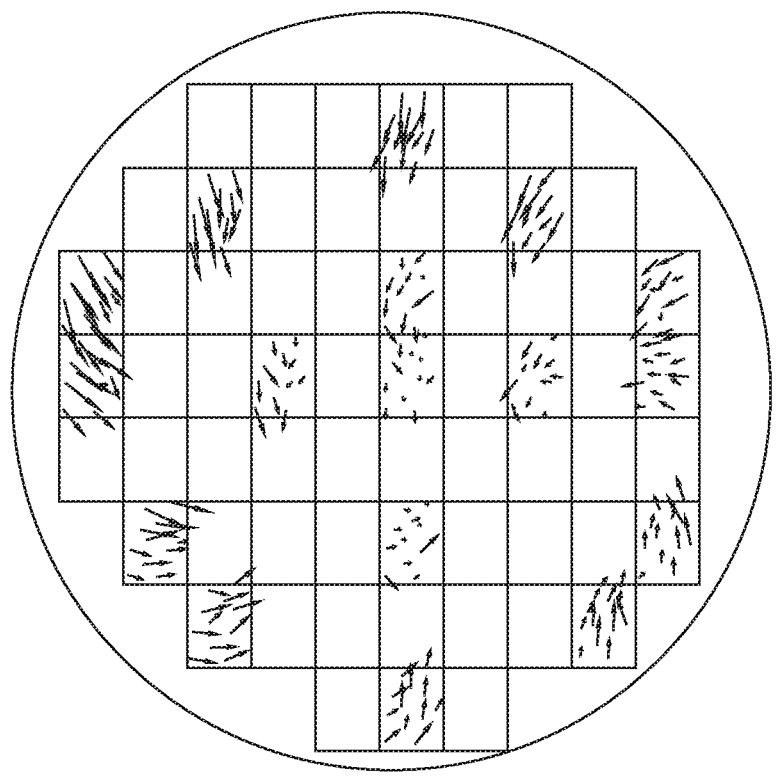
FIG. 4A illustrates an overlay signature measurement across the wafer and a corresponding data table illustrating overlay sensitivity to polarization, in accordance with one or more embodiments of the present disclosure.
Figure 4B:
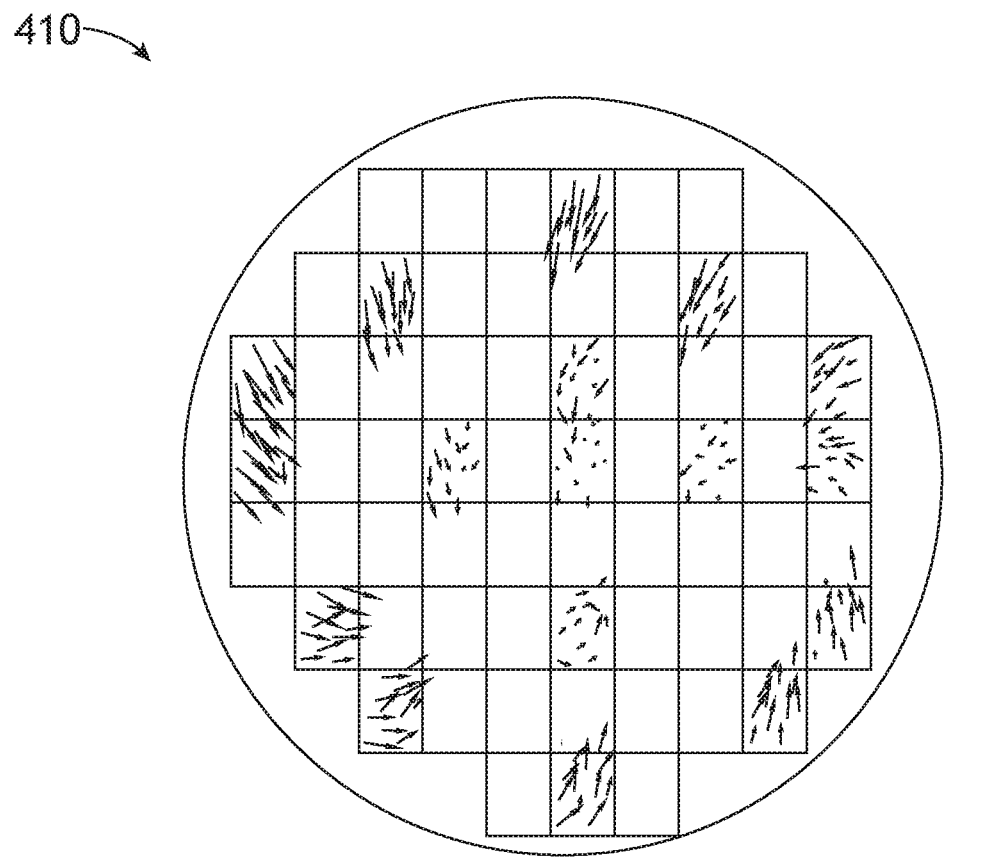
FIG. 4B illustrates an overlay signature measurement across the wafer and a corresponding data table illustrating overlay sensitivity to polarization, in accordance with one or more embodiments of the present disclosure.
Figure 4C:
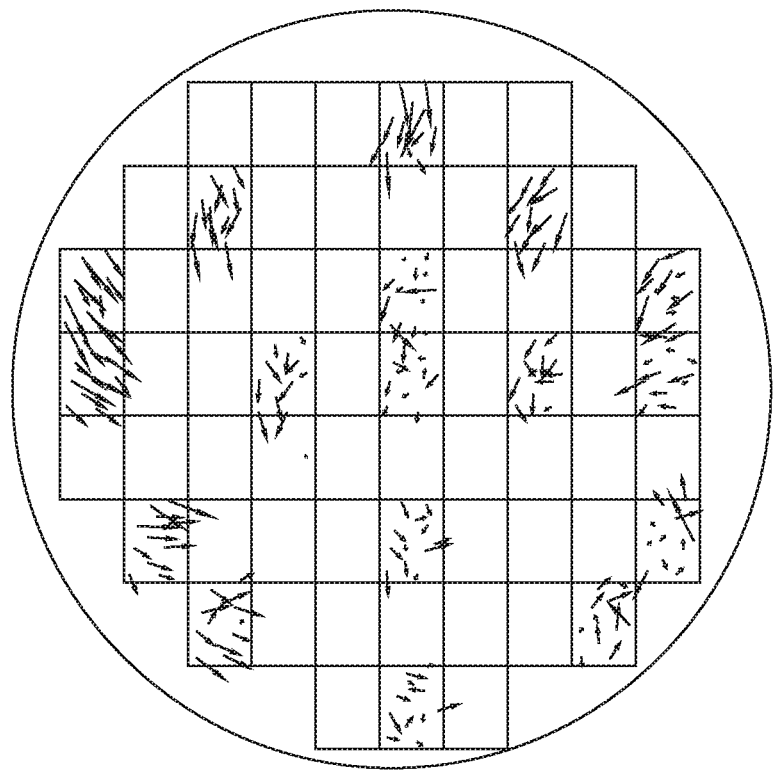
FIG. 4C illustrates an overlay signature measurement across the wafer and a corresponding data table illustrating overlay sensitivity to polarization, in accordance with one or more embodiments of the present disclosure.

FIGS. 4A-4C in general illustrate signature graphs and corresponding data tables, in accordance with one or more embodiments of the present disclosure. In one embodiment, tilt induced by the etcher, having a radial signature, is sensitive to cross-polarization. For example, FIG. 4A illustrates a signature graph 400 for a wafer under unpolarized light (Un-Pol), and a corresponding data table 402 including information for an overlay mean+3 sigma ($\sigma$), and overlay range, in both an X-direction and a Y-direction under Un-Pol. By way of another example, FIG. 4B illustrates a signature graph 410 for a wafer under P-polarized light (P-Pol), and a corresponding data table 412 including information for an overlay mean+3 $\sigma$, and overlay range, in both an X-direction and a Y-direction under P-Pol. By way of another example, FIG. 4C illustrates a signature graph 420 for a wafer under S-polarized light (S-Pol), and a corresponding data table 422 including information for an overlay mean+3$\sigma$, and overlay range, in both an X-direction and a Y-direction under S-Pol. As illustrated in FIGS. 4A-4C, overlay is sensitive to polarization, which may have an impact on overlay mean (or overlay mean+3 $\sigma$) and/or overlay range of variation.

Figure 5A:
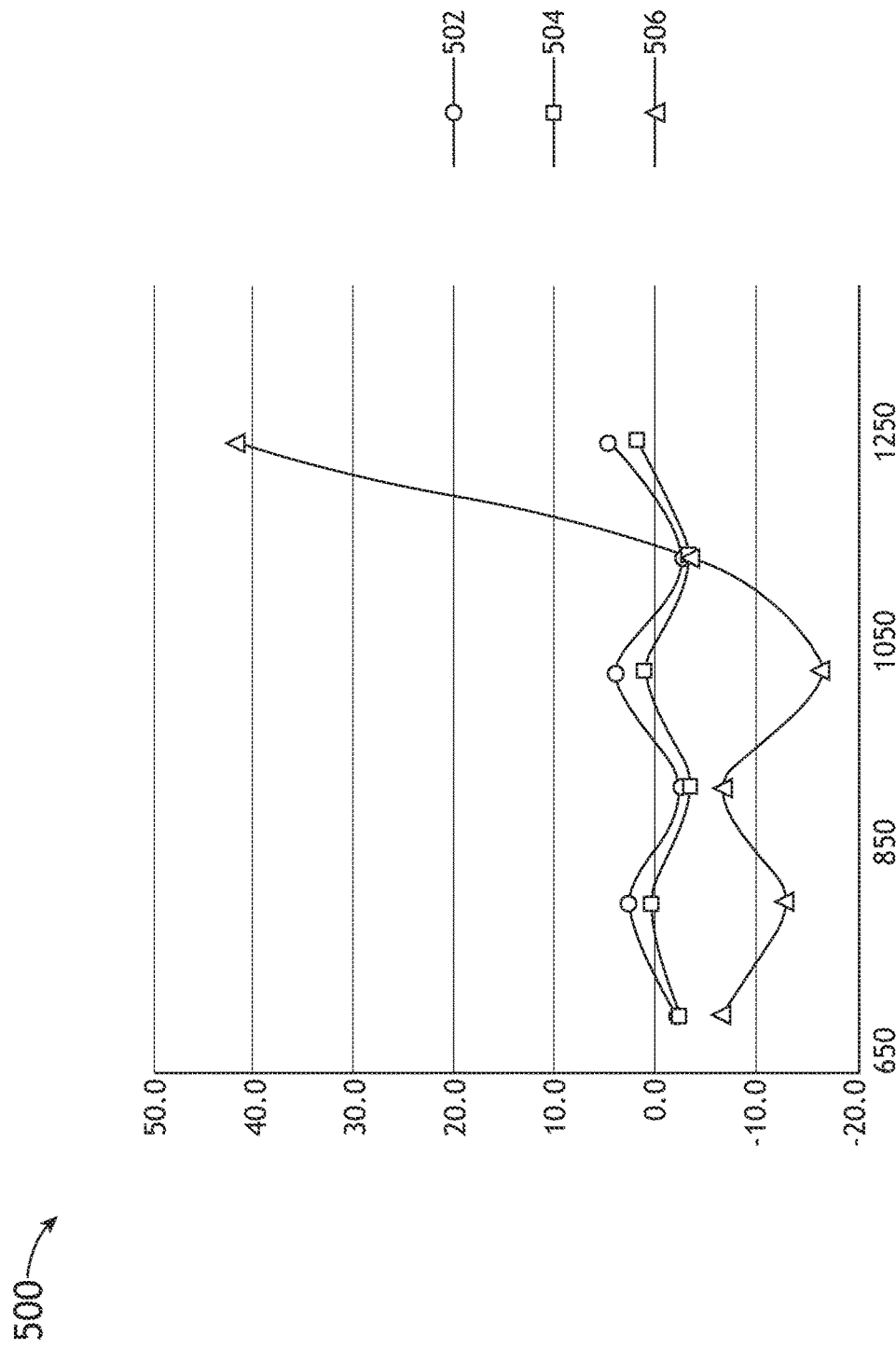
FIG. 5A illustrates a graph comparing overlay inaccuracy to overlay target bar size, in accordance with one or more embodiments of the present disclosure.
Figure 5B:
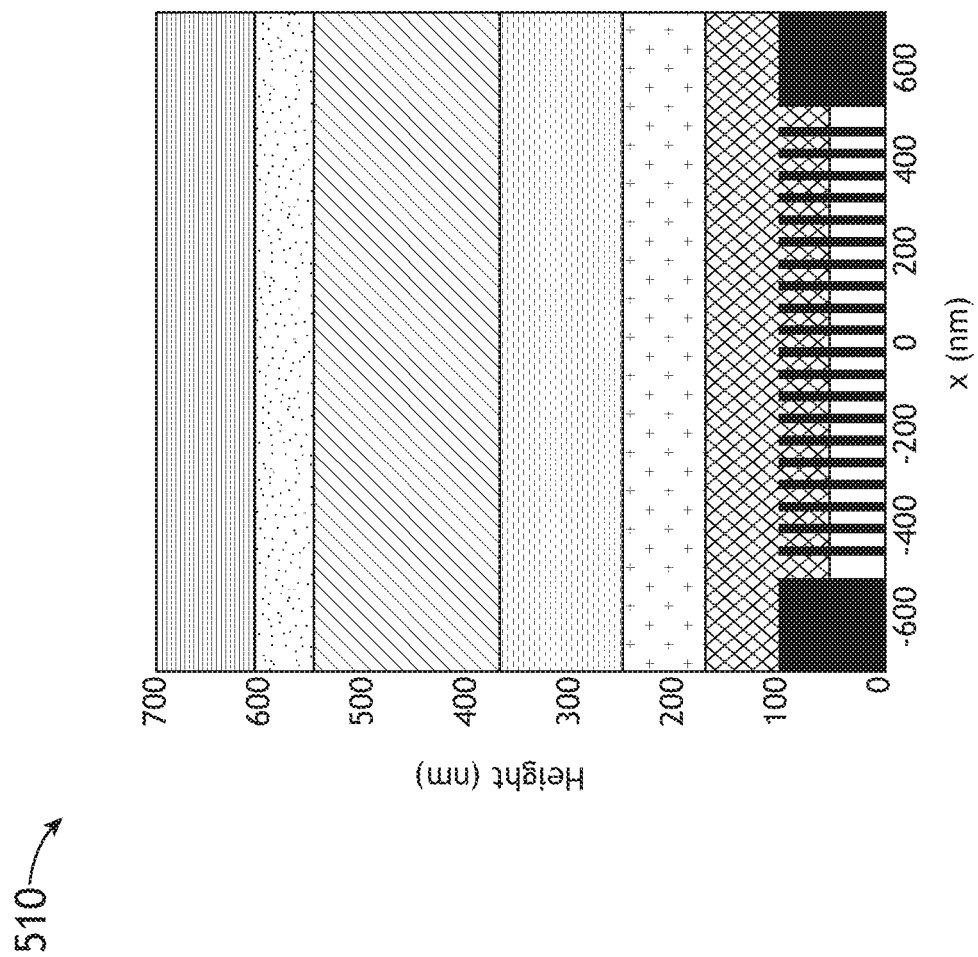
FIG. 5B illustrates a graph comparing height versus width, in accordance with one or more embodiments of the present disclosure.

FIG. 5A illustrates a graph 500 comparing overlay inaccuracy impacted by polarization, in accordance with one or more embodiments of the present disclosure. In one embodiment, polarization impacts the accuracy of overlay measurements. For example, graph 500 compares overlay measurement inaccuracy (in nanometer, or nm) to bar size (in nm) for a wafer under un-polarized light (e.g., line 502), under P-polarized light (e.g., line 504) and under S-polarized light (e.g., line 506). FIG. 5B illustrates an example cross-section of a pattern material stack sample 510 corresponding to the graph 500, in accordance with one or more embodiments of the present disclosure.

In one embodiment, overlay metrology information is used to detect the etch-induced tilt signature in a wafer for the AEI N−1 step. For example, the etch-induced tilt signature may be detected by measuring a previous layer in an ADI process using an imaging metrology target (e.g., an advanced imaging metrology (AIM) target, a box-in-box (BiB) metrology target, a ProAIM™ target, or the like). By way of another example, the etch-induced tilt signature may be detected by measuring a previous layer in an ADI process using cross-polarization. By way of another example, the etch-induced tilt signature may be detected by measuring a previous layer in an ADI process by extraction information from a previous (e.g., N−1) layer.

In one illustrative example embodiment, extracting the tilt signature may include calculating the ratio between a contrast precision (CP) taken from S-polarization measurements and a contrast precision (CP) taken from P-polarization measurements, as illustrated in EQ. 1:

$$\text{Tilt signature} = \Sigma_{k=0}^{n} CP_P^k / CP_S^k \qquad \text{EQ. 1}$$

In EQ. 1, CP is the contrast precision measurement from a previous layer at different polarizations (e.g., $CP_S$ for S-polarization, and $CP_P$ for P-polarization), k is an index running on all targets located in a wafer, and n is an upper boundary for the index k.

From the cross-polarization measurements, a module may be calculated for extracting the rotation term or signature, as illustrated in EQ. 2:

$$\text{Tilt}_x = \Sigma_{n=0}^{N_{loc}} \Sigma_{m=0}^{N_{loc}} a_{nm} X_{loc}^n Y_{loc}^m + \Sigma_{n=0}^{N_{pos}} \Sigma_{m=0}^{N_{pos}} b_{nm} X_{pos}^n Y_{pos}^m \qquad \text{EQ. 2}$$

In EQ. 2, $a_{nm}$ are coefficients, $X_{loc}^n$ is the overlay value in the X direction, $Y_{loc}^m$ is the overlay value in the Y direction, n and m are indexes running on all targets located in a wafer, and $N_{loc}$ is an upper boundary for the indexes n and m. Also in EQ. 2, $b_{nm}$ is the position on the wafer, $X_{pos}^n$ is the overlay value in the X direction, $Y_{pos}^m$ is the overlay value in the Y direction, n and m are indexes running on all targets located in a wafer, and $N_{pos}$ is an upper boundary for the indexes n and m. It is noted herein the coefficient $-a_{01}$ is related to rotation term or signature.

In another illustrative example embodiment, tilt may be calculated by taking through focus (TF) measurement for a previous layer (e.g., N−1) and characterizing the AEI N−1 profile. A calibration for TF and/or CP may be completed prior to the ADI measurements using an Optical Critical Dimension (OCD) library to correlate between focus and CP to a stack geometry of the wafer.

It is noted herein this example embodiment may also be performed with additional information taken from overlay measurements such as accuracy matrix (e.g., a Qmerit function, Kernel variation, through focus, or the like), as illustrated in EQ. 3:

$$\text{Tilt signature} = N_1 \Sigma_{k=0}^{n} CP_P^k / CP_S^k + N_2 \Sigma_{k=0}^{n} TF_P^k / TF_S^k + N_1 \Sigma_{k=0}^{n} Q_{meritp}^k / Q_{merits}^k \qquad \text{EQ. 3}$$

IN EQ. 3, CP is the contrast precision measurement from a previous layer at different polarizations (e.g., $CP_S$ for S-polarization, and $CP_P$ for P-polarization), TF is the through focus measurement from the previous layer at different polarizations (e.g., $TF_S$ for S-polarization, and $TF_P$ for P-polarization), $Q_{merit}$ is the $Q_{merit}$ function measurement from the previous layer at different polarizations (e.g., $Q_{merit_S}$ for S-polarization, and $Q_{merit_P}$ for P-polarization), k is an index running on all targets located in a wafer, n is an upper boundary for the index k, and N is a coefficient which is normalized per merit quality (e.g., $N_1+N_2+N_3=1$).

Figure 6:
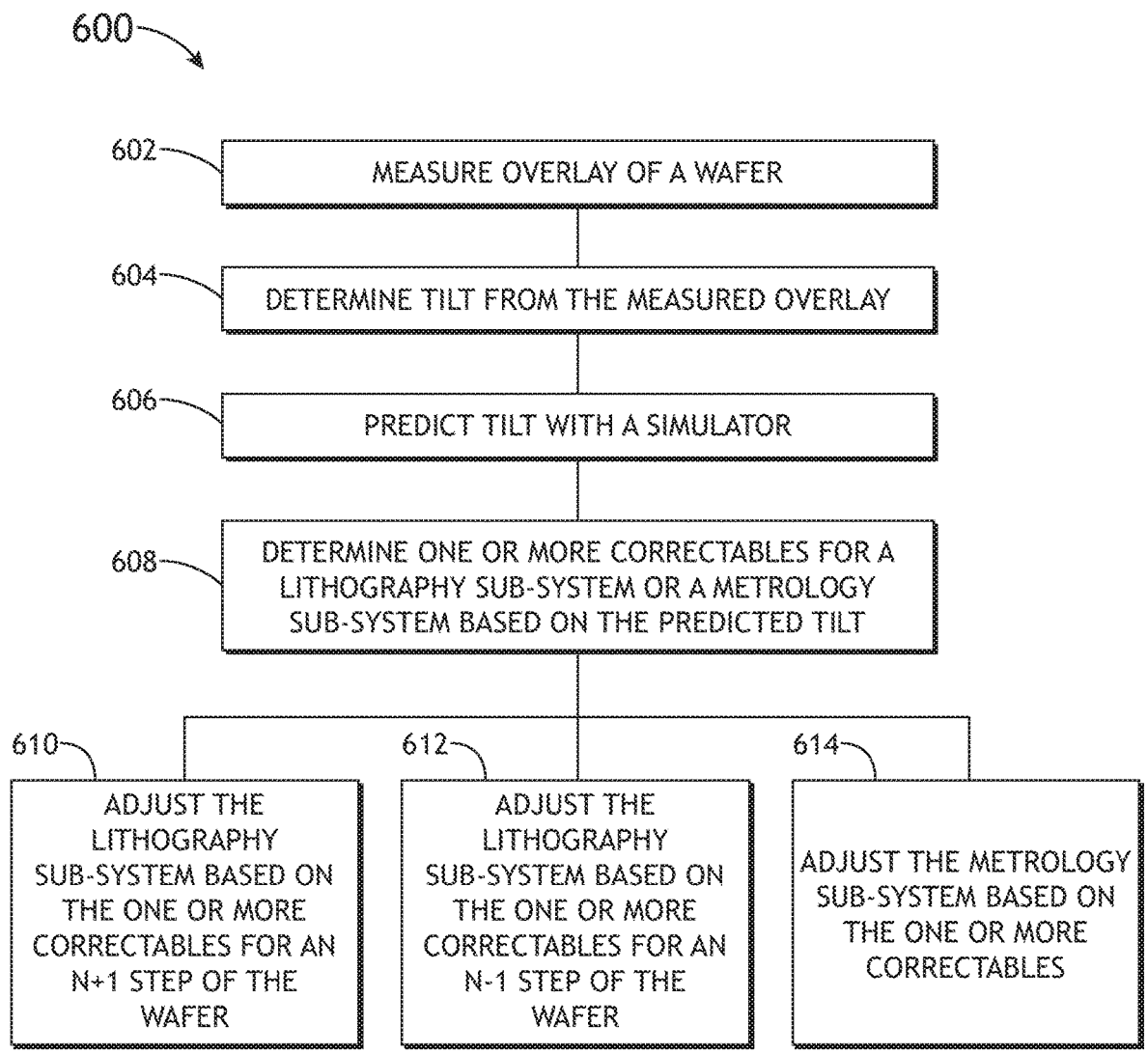
FIG. 6 is a flow diagram illustrating steps performed in a method for predicting and adjusting for etch tilt, in accordance with one or more embodiments of the present disclosure.

In one embodiment, the tilt signature may be taken and used with an etch simulator to predict the etch tilt for the N+1 step. FIG. 6 illustrates a method or process 600 for predicting and adjusting for etch tilt, in accordance with one or more embodiments of the present disclosure.

In a step 602, overlay is measured for a wafer. In one embodiment, overlay is measured with a metrology subsystem 104 for a previous layer (e.g., N−1) of a sample 124 during an ADI step.

In a step 604, tilt within the measured overlay is determined. In one embodiment, an etch-induced tilt signature for the previous layer is calculated by the controller 106 using the overlay ADI measurements.

In a step 606, tilt is predicted with a simulator. In one embodiment, the tilt is predicted for the N+1 etch step using the overlay ADI measurements and the etch-induced tilt signature by the controller 106.

In a step 608, one or more correctables are determined for a lithography sub-system or a metrology sub-system based on the predicted tilt. In one embodiment, the one or more correctables are determined by the controller 106 for the lithography sub-system 102 and/or the metrology sub-system 104. In another embodiment, the one or more correctables are provided to the lithography sub-system 102 and/or the metrology sub-system 104 as one or more control signals. For example, utilization of the one or more correctables by the lithography sub-system 102 and/or the metrology sub-system 104 may reduce or minimize tilt in the sample 124.

In a step 610, the lithography sub-system is adjusted based on the one or more correctables for the next layer (e.g., N+1 step). In one embodiment, the lithography sub-system 102 is an etcher. For example, the signature for etch-induced tilt should be robust and stable, being from dedicated etchers used in an integrated circuitry (IC) process. In another embodiment, one or more operational parameters of the etcher are adjusted based on the one or more correctables to offset the predicted tilt in the N+1 layer of the sample 124.

In a step 612, the lithography sub-system is adjusted based on the one or more correctables for the previous layer (e.g., N−1 step) of the wafer. In one embodiment, one or more operational parameters of the lithography sub-system 102 are adjusted based on the one or more correctables to re-work the N−1 layer of the sample 124. It is noted herein, however, the one or more operational parameters of the lithography sub-system 102 may be adjusted based on the one or more correctables to fabricate an N−1 layer of a second sample 124 with the adjustments, instead of re-working the measured sample 124.

It is noted herein having information about etch-induced tilt during the ADI step may improve the yield of a wafer lot and reduce or minimize scrapped wafers by allowing for the performing of re-working on wafers with tilt excursion already in the ADI step. In addition, having information about etch-induced tilt may increase or optimize the operational parameters of the etcher (e.g., length of etch time, amount of etch material, or the like).

In a step 614, the metrology sub-system is adjusted based on the one or more correctables. In one embodiment, the metrology sub-system 104 is adjusted to improve the accuracy of the overlay measurements (e.g., the measurements taken in step 602).

Figure 7:
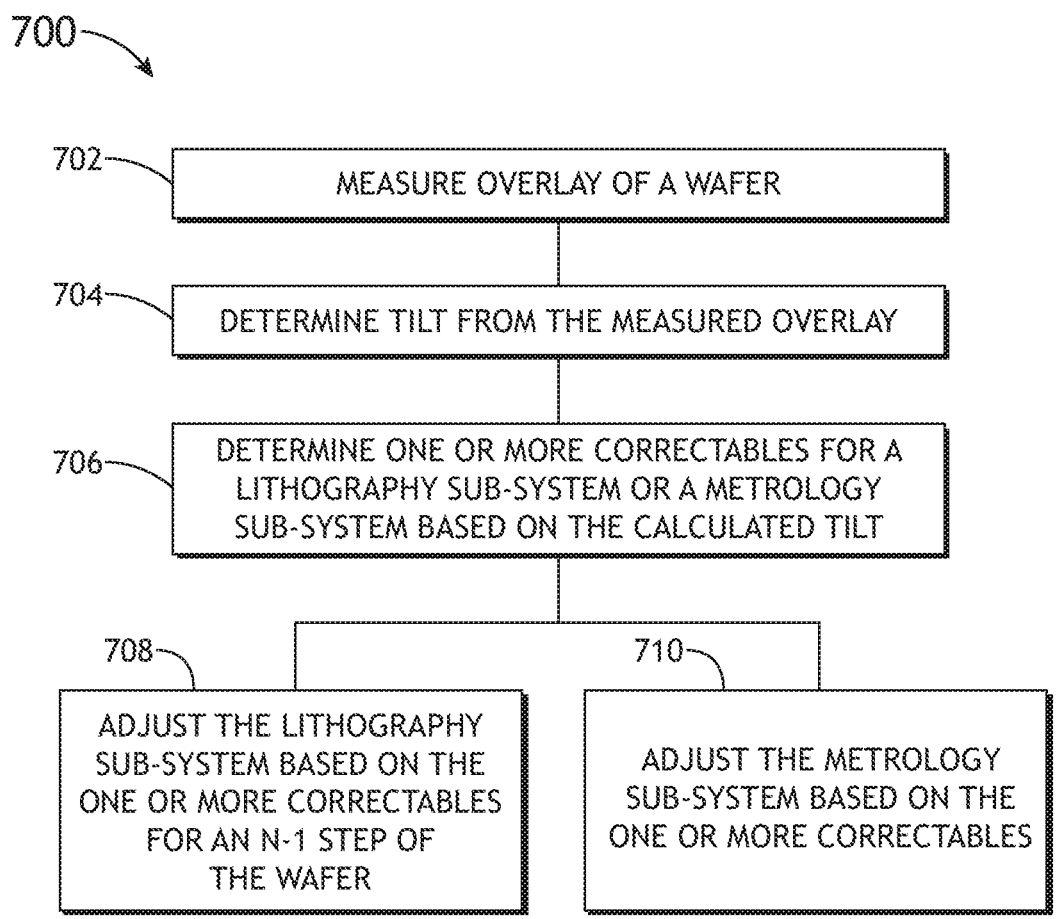
FIG. 7 is a flow diagram illustrating steps performed in a method for extracting and adjusting for etch tilt, in accordance with one or more embodiments of the present disclosure.

Although embodiments of the present disclosure are directed to predicted etch-induced tilt during the ADI step, it is noted herein a similar approach may be taken with the AEI step. FIG. 7 illustrates a method or process 700 for extracting and adjusting for etch tilt, in accordance with one or more embodiments of the present disclosure.

In a step 702, overlay is measured for a wafer. In one embodiment, overlay is measured of a sample 124 with a metrology sub-system 104 during an AEI step. For example, the same imaging metrology targets used in the ADI step (e.g., as discussed with respect to the method or process 600) may be measured during the AEI step.

In a step 704, tilt within the measured overlay is determined. In one embodiment, an etch-induced tilt signature for the current layer is extracted by the controller 106 from the overlay AEI measurements.

In a step 706, one or more correctables are determined for a lithography sub-system or a metrology sub-system based on the determined tilt. In one embodiment, the one or more correctables are determined by the controller 106 for the lithography sub-system 102 and/or the metrology sub-system 104. In another embodiment, the one or more correctables are provided to the lithography sub-system 102 and/or the metrology sub-system 104 as one or more control signals. For example, utilization of the one or more correctables by the lithography sub-system 102 and/or the metrology sub-system 104 may reduce or minimize tilt in the sample 124.

In a step 708, the lithography sub-system is adjusted based on the one or more correctables for the previous layer (e.g., N−1 step) of the wafer. In one embodiment, the lithography sub-system 102 is an etcher. For example, the signature for etch-induced tilt should be robust and stable, being from dedicated etchers used in an integrated circuitry (IC) process. In another embodiment, one or more operational parameters of the lithography sub-system 102 are adjusted based on the one or more correctables to fabricate an N−1 layer of a second wafer with the adjustments, instead of re-working the measured wafer. It is noted herein, however, the one or more operational parameters of the lithography sub-system 102 may be adjusted based on the one or more correctables to re-work the N−1 layer of the wafer.

It is noted herein having information about etch-induced tilt during the AEI step may reduce a number of dedicated tilt metrology tools required, by increasing utilization of overlay metrology tools.

In a step 710, the metrology sub-system is adjusted based on the one or more correctables. In one embodiment, the metrology sub-system 104 is adjusted to improve the accuracy of the overlay measurements (e.g., the measurements taken in step 702).

Although embodiments of the present disclosure are directed to determining signatures for etch-induced tilt, it is noted herein signatures may be determined for tilt induced by other lithography processes or sub-systems. Therefore, the above description should not be interpreted as a limitation on the present disclosure but merely an illustration.

It is noted herein the one or more processors 108 of the controller 106 may be configured to perform one or more steps of the methods or processes 600 and 700, as described above.

In addition, it is noted herein the steps of the methods or processes 600 and 700 may be implemented all or in part by the system 100 and/or components of the system 100. It is further recognized, however, that the methods or processes 600 and 700 are not limited to the system 100 and/or components of the system 100 in that additional or alternative system-level embodiments may carry out all or part of the methods or processes 600 and 700.

Further, it is noted herein the methods or processes 600 and 700 are not limited to the steps and/or sub-steps provided. The methods or processes 600 and 700 may include more or fewer steps and/or sub-steps. The methods or processes 600 and 700 may perform the steps and/or sub-steps simultaneously. For example, steps 610, 612, and 614 may be performed simultaneously. The methods or processes 600 and 700 may perform the steps and/or sub-steps sequentially, including in the order provided or an order other than provided. For example, steps 610, 612, and 614 may be performed in a particular order or subset of order. Therefore, the above description should not be interpreted as a limitation on the scope of the disclosure but merely an illustration.

All of the methods or processes described herein may include storing results of one or more steps of the method or process embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is noted herein that any language directed to a particular embodiment described in the present disclosure may be applicable to a different embodiment described in the present disclosure, such that the various embodiments described in the present disclosure should not be considered stand-alone or separate embodiments. For example, the present disclosure may be read as being able to combine any number of one or more metrology targets, one or more layers, one or more cells, one or more target designs, and/or one or more pitches or other parameters or metrics of the target design as described throughout the present disclosure on the sample 124. By way of another example, the present disclosure may be read as being able to combine any number of metrology sample or target design processes, fabrication processes, and/or measurement processes as described throughout the present disclosure. Therefore, the above description should not be interpreted as a limitation on the present disclosure but merely an illustration.

In this regard, the embodiments of the present disclosure illustrate new methods and systems for determining tilt induced by an etching process using overlay AEI data. In addition, the new methods and systems may calculate etch tilt for a previous layer using overlay ADI data. Further, the new methods and systems may predict tilt for an N+1 etch step using overlay ADI data. Further, the new methods and systems may calculate an overlay measurement in an ADI process based on tilt information for a previous layer for better overlay accuracy.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken as limiting.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

The previous description is presented to enable one of ordinary skill in the art to make and use the invention as provided in the context of a particular application and its requirements. As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random-access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A system for tilt calculation based on overlay metrology measurements, comprising:
   a controller communicatively coupled to one or more metrology tools configured to hold a metrology sample, wherein the controller includes one or more processors configured to execute program instructions causing the one or more processors to:
   receive one or more overlay metrology measurements of one or more metrology targets of the metrology sample from the one or more metrology tools, wherein the one or more overlay metrology measurements are taken following an after develop inspection (ADI) process;
   determine tilt from the one or more overlay metrology measurements;
   predict tilt with a simulator based on at least the determined tilt; and
   determine one or more correctables for at least one of one or more lithography tools or the one or more metrology tools to adjust for the predicted tilt, wherein the one or more correctables are configured to reduce an amount of tilt in the sample or overlay inaccuracy of the one or more overlay metrology measurements.

2. The system of claim 1, wherein the one or more correctables are provided to the one or more lithography tools as one or more control signals.

3. The system of claim 2, wherein the one or more lithography tools is adjusted based on the one or more correctables to reduce the amount of tilt caused by an N+1 step of the sample.

4. The system of claim 2, wherein the one or more lithography tools is adjusted based on the one or more correctables to reduce the amount of tilt caused by an N−1 step of the sample.

5. The system of claim 1, wherein the one or more correctables are provided to the one or more metrology tools as one or more control signals.

6. The system of claim 5, wherein the one or more metrology tools is adjusted based on the one or more correctables to reduce the overlay inaccuracy in the one or more overlay metrology measurements.

7. The system of claim 1, wherein the one or more lithography tools include an etcher.

8. The system of claim 1, wherein the one or more metrology tools include at least one of an electron-beam metrology tool or an optical metrology tool.

9. A system for error reduction in metrology measurements, comprising:
   one or more metrology tools configured to hold a metrology sample; and
   a controller communicatively coupled to the one or more metrology tools, wherein the controller includes one or more processors configured to execute program instructions causing the one or more processors to:
   receive one or more overlay metrology measurements of one or more metrology targets of the metrology sample from the one or more metrology tools, wherein the one or more overlay metrology measurements are taken following an after develop inspection (ADI) process;

determine tilt from the one or more overlay metrology measurements;

predict tilt with a simulator based on at least the determined tilt; and determine one or more correctables for at least one of one or more lithography tools or the one or more metrology tools to adjust for the predicted tilt, wherein the one or more correctables are configured to reduce an amount of tilt in the sample or overlay inaccuracy of the one or more overlay metrology measurements.

10. The system of claim 9, wherein the one or more correctables are provided to the one or more lithography tools as one or more control signals.

11. The system of claim 10, wherein the one or more lithography tools is adjusted based on the one or more correctables to reduce the amount of tilt caused by an N+1 step of the sample.

12. The system of claim 10, wherein the one or more lithography tools is adjusted based on the one or more correctables to reduce the amount of tilt caused by an N−1 step of the sample.

13. The system of claim 9, wherein the one or more correctables are provided to the one or more metrology tools as one or more control signals.

14. The system of claim 13, wherein the one or more metrology tools are adjusted based on the one or more correctables to reduce the overlay inaccuracy in the one or more overlay metrology measurements.

15. The system of claim 9, wherein the one or more lithography tools include an etcher.

16. The system of claim 9, wherein the one or more metrology tools include at least one of an electron-beam metrology tool or an optical metrology tool.

17. A method comprising:

receiving one or more overlay metrology measurements of one or more metrology targets of a metrology sample from one or more metrology tools, wherein the one or more overlay metrology measurements are taken following an after develop inspection (ADI) process;

determining tilt from the one or more overlay metrology measurements;

predicting tilt with a simulator based on at least the determined tilt; and determining one or more correctables for at least one of one or more lithography tools or the one or more metrology tools to adjust for the predicted tilt, wherein the one or more correctables are configured to reduce an amount of tilt in the sample or overlay inaccuracy of the one or more overlay metrology measurements.

18. The method of claim 17, wherein the one or more correctables are provided to the one or more lithography tools as one or more control signals.

19. The method of claim 18, wherein the one or more lithography tools is adjusted based on the one or more correctables to reduce the amount of tilt caused by an N+1 step of the sample.

20. The method of claim 18, wherein the one or more lithography tools is adjusted based on the one or more correctables to reduce the amount of tilt caused by an N−1 step of the sample.

21. The method of claim 17, wherein the one or more correctables are provided to the one or more metrology tools as one or more control signals.

22. The method of claim 21, wherein the one or more metrology tools are adjusted based on the one or more correctables to reduce the overlay inaccuracy in the one or more overlay metrology measurements.

23. The method of claim 17, wherein the one or more lithography tools include an etcher.

24. The method of claim 17, wherein the one or more metrology tools include at least one of an electron-beam metrology tool or an optical metrology tool.

25. A system for tilt calculation based on overlay metrology measurements, comprising:

a controller communicatively coupled to one or more metrology tools configured to hold a metrology sample, wherein the controller includes one or more processors configured to execute program instructions causing the one or more processors to:

receive one or more overlay metrology measurements of one or more metrology targets of the metrology sample from the one or more metrology tools, wherein the one or more overlay metrology measurements are taken during an after etch inspection (AEI) process;

determine etch-induced tilt signature from the one or more overlay metrology measurements, wherein the etch-induced tilt signature is based on contrast precision measurements acquired from S-polarization measurements and contrast precision measurements acquired from P-polarization measurements; and determine one or more correctables for at least one of one or more lithography tools or the one or more metrology tools to adjust for the determined etch-induced tilt signature, wherein the one or more correctables are configured to reduce an amount of tilt in the sample or overlay inaccuracy of the one or more overlay metrology measurements.

26. The system of claim 25, wherein the one or more correctables are provided to the one or more lithography tools as one or more control signals.

27. The system of claim 26, wherein the one or more lithography tools is adjusted based on the one or more correctables to reduce the amount of tilt caused by an N−1 step of the sample.

28. The system of claim 25, wherein the one or more correctables are provided to the one or more metrology tools as one or more control signals.

29. The system of claim 28, wherein the one or more metrology tools are adjusted based on the one or more correctables to reduce the overlay inaccuracy in the one or more overlay metrology measurements.

30. The system of claim 25, wherein the one or more lithography tools include an etcher.

31. The system of claim 25, wherein the one or more metrology tools include at least one of an electron-beam metrology tool or an optical metrology tool.

32. A system for error reduction in metrology measurements, comprising:

one or more metrology tools configured to hold a metrology sample; and a controller communicatively coupled to the one or more metrology tools, wherein the controller includes one or more processors configured to execute program instructions causing the one or more processors to:

receive one or more overlay metrology measurements of one or more metrology targets of the metrology sample from the one or more metrology tools, wherein the one or more overlay metrology measurements are taken during an after etch inspection (AEI) process;

determine etch-induced tilt signature from the one or more overlay metrology measurements, wherein the etch-induced tilt signature is based on contrast precision measurements acquired from S-polarization measurements and contrast precision measurements acquired from P-polarization measurements; and determine one or more correctables for at least one of one or more lithography tools or the one or more metrology tools to adjust for the determined etch-induced tilt signature, wherein the one or more correctables are configured to reduce an amount of tilt in the sample or overlay inaccuracy of the one or more overlay metrology measurements.

33. The system of claim 32, wherein the one or more correctables are provided to the one or more lithography tools as one or more control signals.

34. The system of claim 33, wherein the one or more lithography tools is adjusted based on the one or more correctables to reduce the amount of tilt caused by an N−1 step of the sample.

35. The system of claim 32, wherein the one or more correctables are provided to the one or more metrology tools as one or more control signals.

36. The system of claim 35, wherein the one or more metrology tools are adjusted based on the one or more correctables to reduce the overlay inaccuracy in the one or more overlay metrology measurements.

37. The system of claim 32, wherein the one or more lithography tools include an etcher.

38. The system of claim 32, wherein the one or more metrology tools include at least one of an electron-beam metrology tool or an optical metrology tool.

39. A method comprising:

receiving one or more overlay metrology measurements of one or more metrology targets of a metrology sample from one or more metrology tools, wherein the one or more overlay metrology measurements are taken during an after etch inspection (AEI) process;

determining an etch-induced tilt signature from the one or more overlay metrology measurements, wherein the etch-induced tilt signature is based on contrast precision measurements acquired from S-polarization measurements and contrast precision measurements acquired from P-polarization measurements; and determining one or more correctables for at least one of one or more lithography tools or the one or more metrology tools to adjust for the determined etch-induced tilt signature, wherein the one or more correctables are configured to reduce an amount of tilt in the sample or overlay inaccuracy of the one or more overlay metrology measurements.

40. The method of claim 39, wherein the one or more correctables are provided to the one or more lithography tools as one or more control signals.

41. The method of claim 40, wherein the one or more lithography tools is adjusted based on the one or more correctables to reduce the amount of tilt caused by an N−1 step of the sample.

42. The method of claim 39, wherein the one or more correctables are provided to the one or more metrology tools as one or more control signals.

43. The method of claim 42, wherein the one or more metrology tools are adjusted based on the one or more correctables to reduce the overlay inaccuracy in the one or more overlay metrology measurements.

44. The method of claim 39, wherein the one or more lithography tools include an etcher.

45. The method of claim 39, wherein the one or more metrology tools include at least one of an electron-beam metrology tool or an optical metrology tool.

* * * * *